(12) United States Patent
Chan et al.

(10) Patent No.: US 7,978,288 B2
(45) Date of Patent: Jul. 12, 2011

(54) DISPLAY DEVICE, METHOD OF THE SAME AND ELECTRONIC DEVICE INCLUDING THE SAME

(75) Inventors: Chuan-Yi Chan, Taipei (TW); Du-Zen Peng, Jhubei (TW); Chang-Ho Tseng, Xinwu Shiang (TW)

(73) Assignee: Chimei Innolux Corporation, Miao-Li County (TW)

( * ) Notice: Subject to any disclaimer, the term of this patent is extended or adjusted under 35 U.S.C. 154(b) by 351 days.

(21) Appl. No.: 12/272,102

(22) Filed: Nov. 17, 2008

(65) Prior Publication Data

US 2009/0128736 A1    May 21, 2009

(30) Foreign Application Priority Data

Nov. 21, 2007   (TW) .............................. 96144055 A

(51) Int. Cl.
*G02F 1/1335*   (2006.01)
*G02F 1/1343*   (2006.01)
*G02F 1/1333*   (2006.01)

(52) U.S. Cl. ........... 349/114; 349/113; 349/147; 349/84

(58) Field of Classification Search ................... 349/113, 349/114, 147, 84
See application file for complete search history.

(56) References Cited

U.S. PATENT DOCUMENTS

| 7,619,258 | B2* | 11/2009 | Tsuchiya et al. ................ 257/83 |
| 7,723,179 | B2* | 5/2010 | Yamazaki et al. ............ 438/233 |
| 2006/0243976 | A1 | 11/2006 | Shin | |

FOREIGN PATENT DOCUMENTS

CN        1855526 A    11/2006
* cited by examiner

*Primary Examiner* — Mike Qi
(74) *Attorney, Agent, or Firm* — Tim Tingkang Xia; Morris, Manning & Martin, LLP

(57) ABSTRACT

A display device including a substrate, a driving element, a reflective layer and a first auxiliary layer is provided. The substrate has a first area and a second area. The driving element is placed within the first area. The reflective layer is placed above the first area and at least a portion of the second area and coupled to the driving element. The first auxiliary layer is placed on the reflective layer above the first area. The first auxiliary layer improves the electrical characteristic of the reflective layer. A reflectance of the first auxiliary layer is not larger than a reflectance of the reflective layer.

13 Claims, 8 Drawing Sheets

DISPLAY DEVICE, METHOD OF THE SAME AND ELECTRONIC DEVICE INCLUDING THE SAME

CROSS REFERENCE TO RELATED APPLICATIONS

This application claims the right of priority based on Taiwan Patent Application No. 096144055 entitled "DISPLAY DEVICE, METHOD OF THE SAME AND ELECTRONIC DEVICE INCLUDING THE SAME", filed on Nov. 21, 2007, which is incorporated herein by reference and assigned to the assignee herein.

FIELD OF INVENTION

The present invention relates to a display device, a method of manufacturing the display device and an electronic device including the display device. Particularly, the present invention relates to a display device having a reflective layer, a method of manufacturing the display device and an electronic device including the display device.

BACKGROUND OF THE INVENTION

Flat panel display devices of the self-luminous type, the reflective-type, or the transflective-type all require the reflective layers. For the self-luminous type, the reflective layer reflects the light from the light emitting elements back to the viewer; for the reflective type or the transflective type, the reflective layer reflects the ambient light back to the viewer.

FIG. 1 illustrates a conventional top emission OLED. A reflective layer 103 is placed in the light emitting area and is typically composed of a single material such as Aluminum. An electrode 105 is formed on the reflective layer 103 and is composed of indium tin oxide (ITO). The light emitting material 107 and another electrode 109 are further formed on the electrode 105. However, there would be some problems due to the process of manufacturing the electrode 105, which causes the oxidation of the reflective layer 103 and increases the resistance of the reflective layer 103, so that the driving current from the driving element 101 to the electrode 105 would be affected. In addition, the conventional reflective layer 103 may have the hillocks causing the shorts to affect the operation of the display device.

Prior art tried to solve this problem by introducing a metal layer between the reflective layer 103 and the electrode 105 to prevent the oxidation and the hillock of the reflective layer 103. But the reflectance of this introduced metal layer is not as good as the reflective layer 103 and cannot achieve the desired reflective effect.

Therefore, it is desired to have a display device, a method of manufacturing the display device and an electronic device including the display device, wherein a reflective layer having a good conductivity is adopted without degrading the reflective effect required for the display device.

SUMMARY OF THE INVENTION

The present invention provides a display device, a method of manufacturing the display device and an electronic device including the display device, wherein a reflective layer having a good conductivity is adopted without degrading the reflective effect required for the display device.

In one aspect of the present invention, the display device including a substrate, a driving element, a reflective layer, and a first auxiliary layer is provided. The substrate has a first area and a second area. The driving element is placed within the first area. The reflective layer placed above the first area and at least a portion of the second area is coupled to the driving element. The first auxiliary layer is placed on the reflective layer above the first area. The first auxiliary layer improves the electrical characteristic of the reflective layer or prevents the resistance of the reflective layer from increasing. The reflectance of the first auxiliary layer is not greater than the reflectance of the reflective layer.

When the first auxiliary layer improves the electrical characteristic of the reflective layer, it further prevents the hillock and/or the oxidation on the reflective layer. The reflectance of the first auxiliary layer is not greater than 80%, and the reflectance of the reflective layer is not lower than 80%. The reflective layer can include aluminum, aluminum alloy, silver, silver alloy, nickel, palladium, copper, neodymium, or any combinations thereof. The first auxiliary layer can include titanium, tungsten molybdenum, indium tin oxide, indium zinc oxide, zinc oxide, or any combinations thereof.

The display device further includes a transparent electrode placed on the first auxiliary layer above the first area and placed on the reflective layer above the second area. During the operation of the display device, the current flows from the driving element to the reflective layer of the first area, the first auxiliary layer, the transparent electrode on the first auxiliary layer above the first area and the transparent electrode on the reflective layer above the second area. The transparent electrode can be indium tin oxide, indium zinc oxide, zinc oxide, or any combinations thereof.

The display device further includes a second auxiliary layer placed between the reflective layer and the substrate for improving adhesion therebetween. The second auxiliary layer can include titanium, tungsten molybdenum, indium tin oxide, indium zinc oxide, zinc oxide, or any combinations thereof.

In another aspect of the present invention, an electronic device includes the foregoing display device and an input unit. The input unit is coupled to the display device and transmits signal to the display device to control the display device displaying images. The electronic device can be a mobile phone, a digital camera, a personal digital assistant (PDA), a notebook computer, a desktop computer, a television, a car media player, a portable video player, a GPS device, an avionics display or a digital photo frame.

The foregoing and other features of the present invention will be apparent from the following more particular description of embodiment of the invention.

BRIEF DESCRIPTION OF THE DRAWINGS

The present invention is illustrated by way of example and not intended to be limited by the figures of the accompanying drawing, in which like notations indicate similar elements.

DETAILED DESCRIPTION

FIG. 2a to FIG. 2i are cross-sectional views of the display device according to an embodiment of the present invention.

Figure 1:
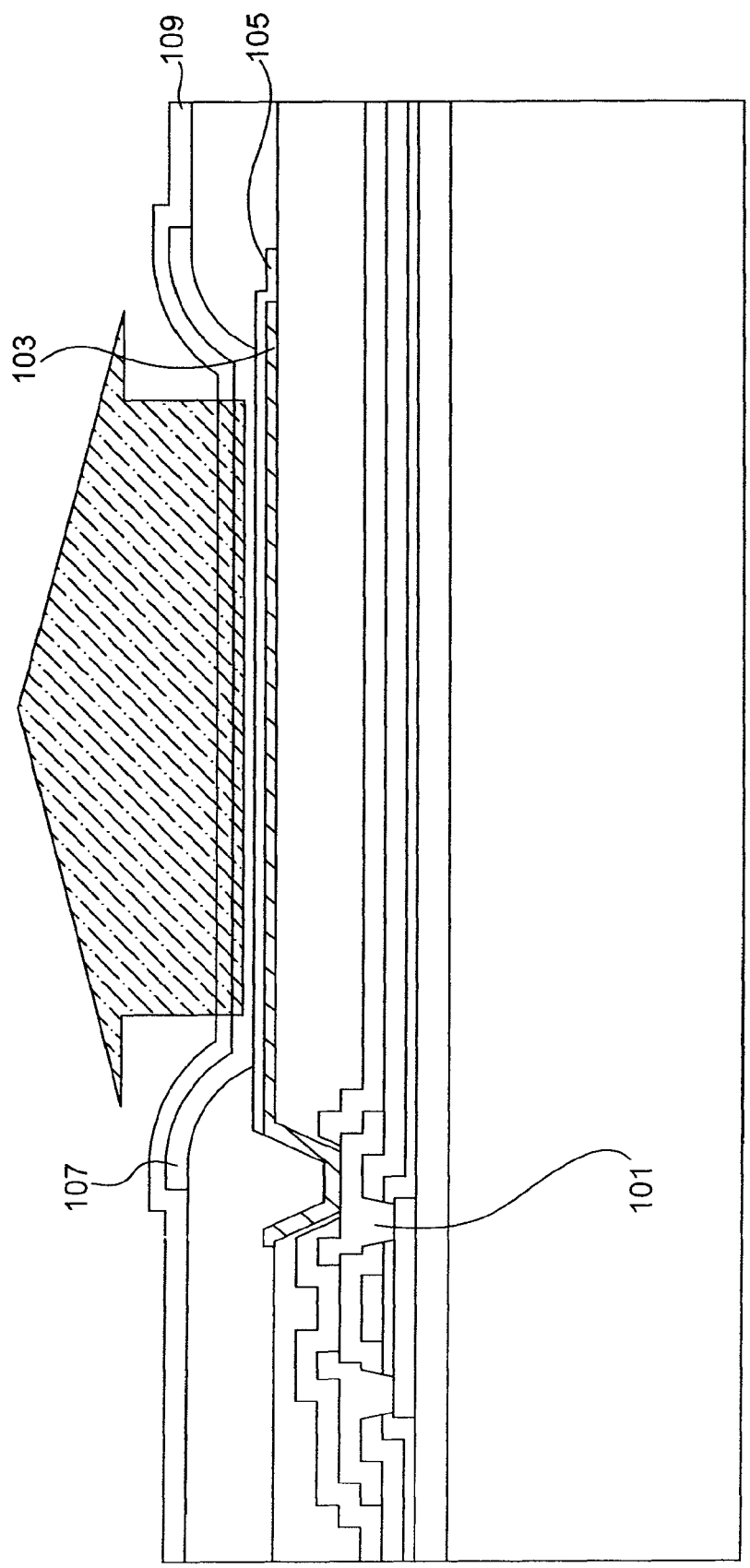
FIG. 1 illustrates a conventional top emission OLED.
Figure 2A:
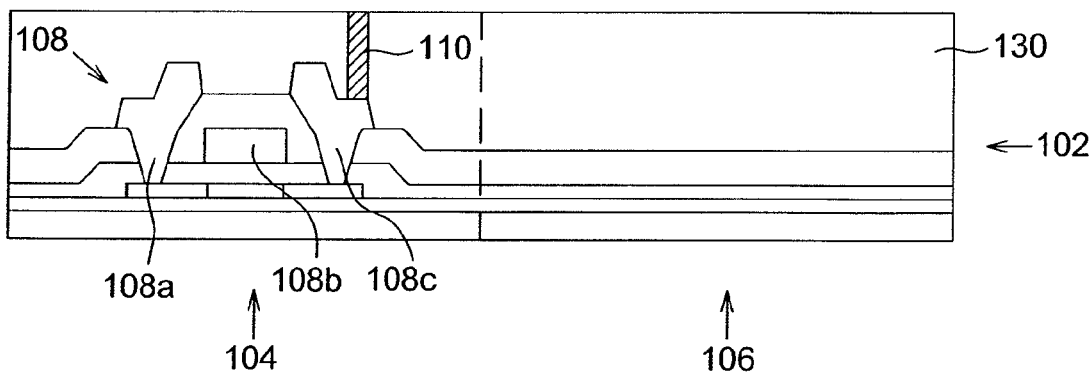
FIGS. 2a-2i are cross-sectional views of the display device according to an embodiment of the present invention.
Figure 2B:
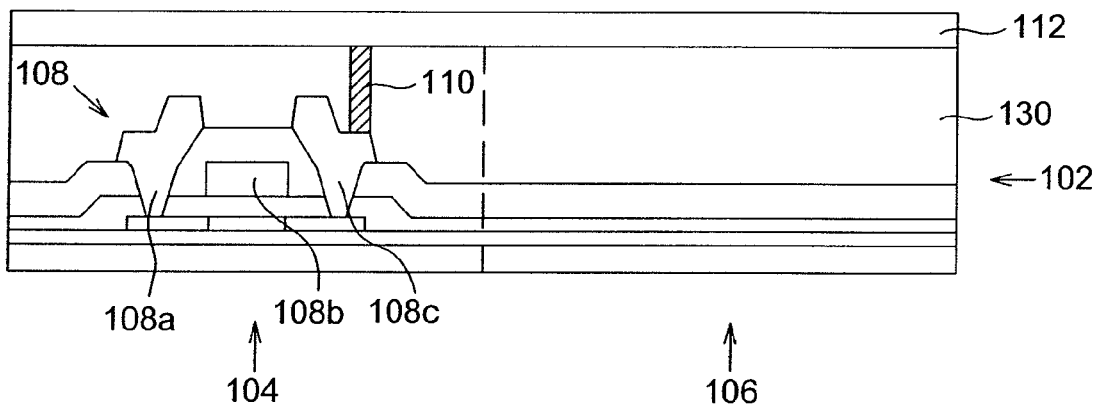
Figure 2C:
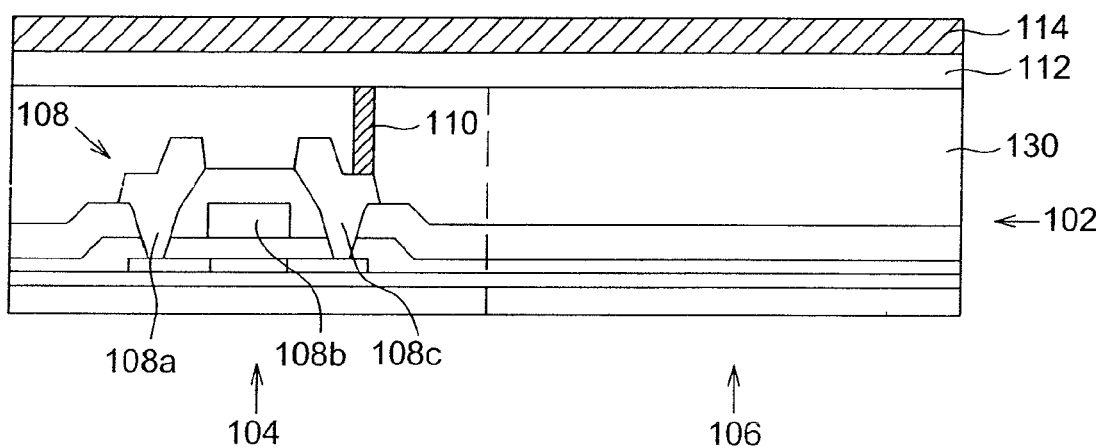
Figure 2D:
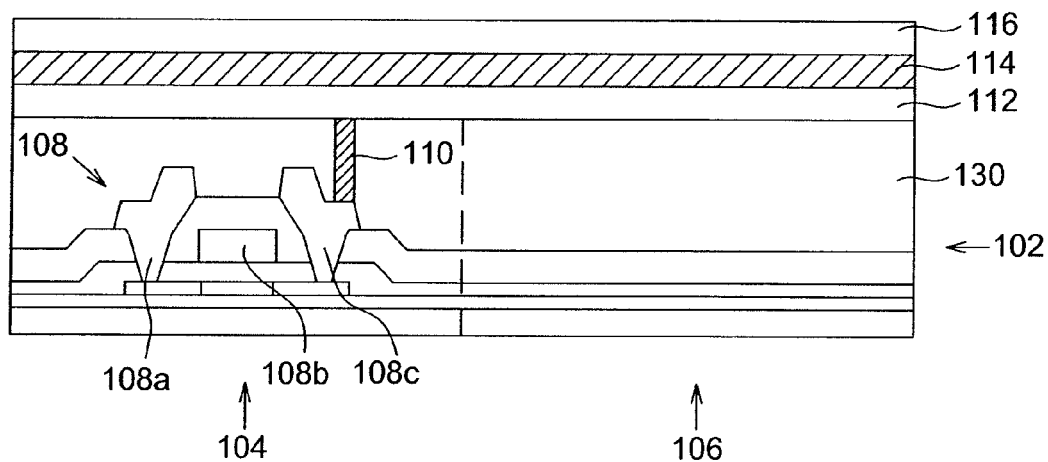
Figure 2E:
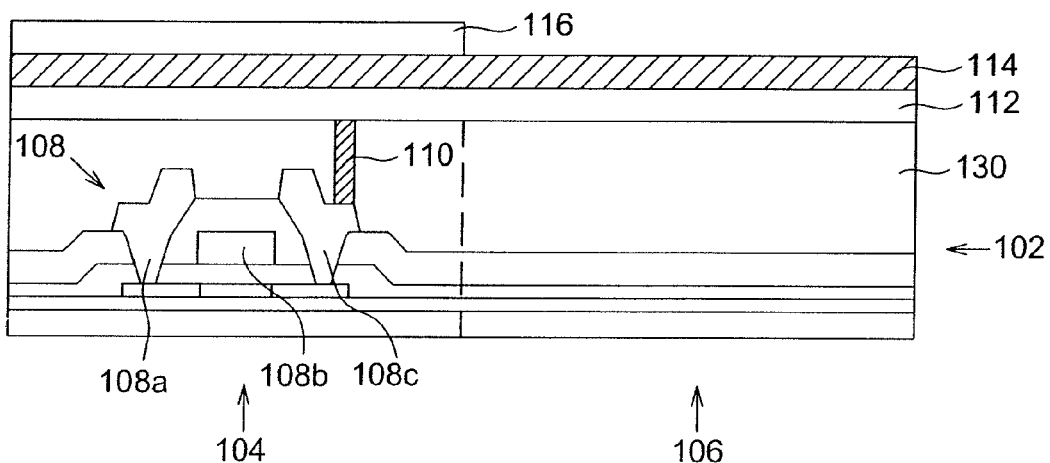
Figure 2F:
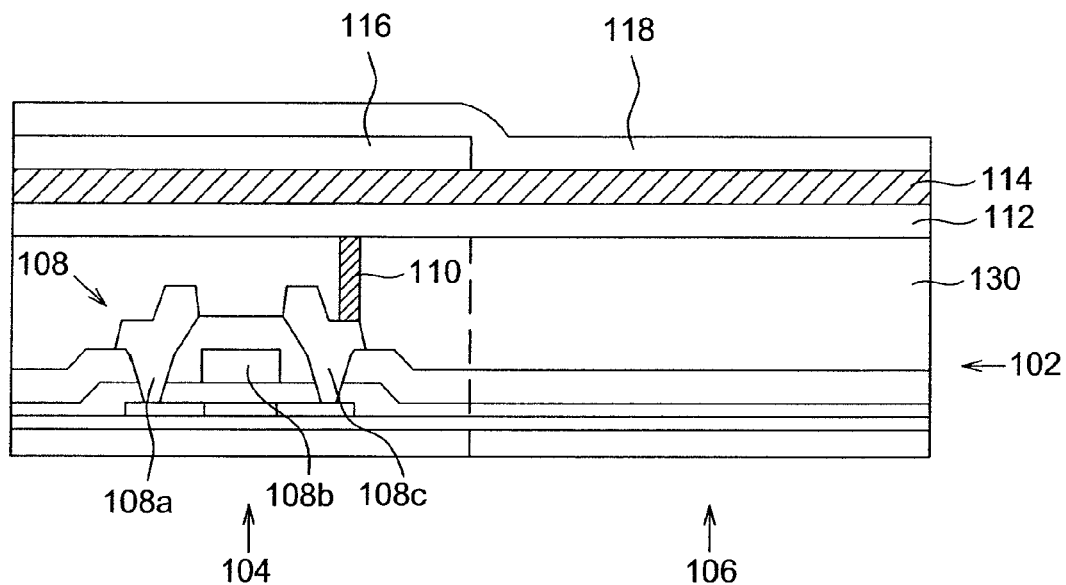
Figure 2G:
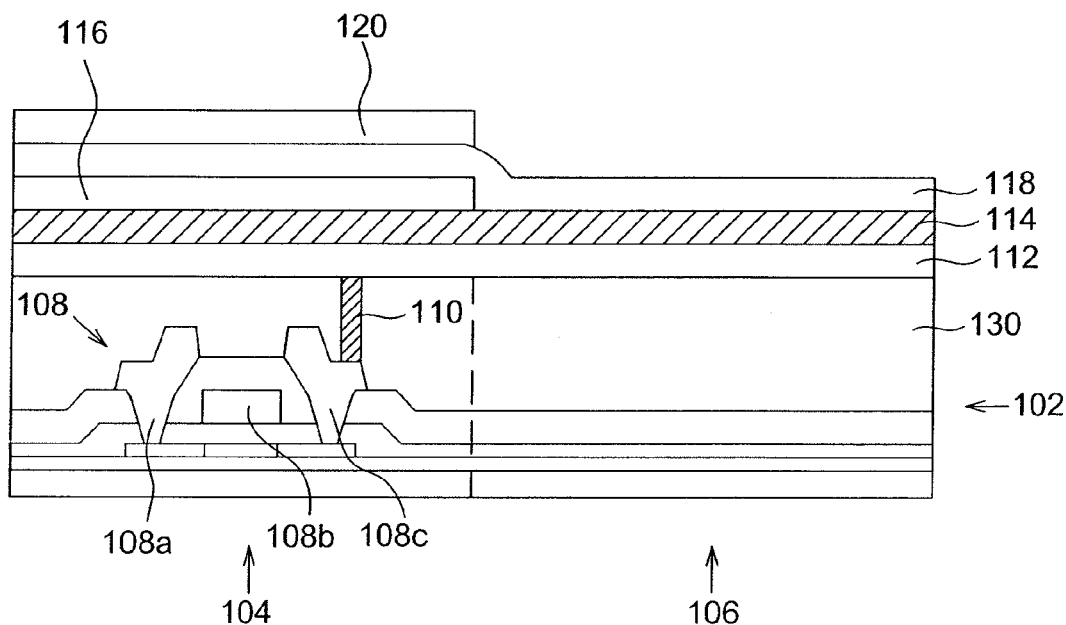
Figure 2H:
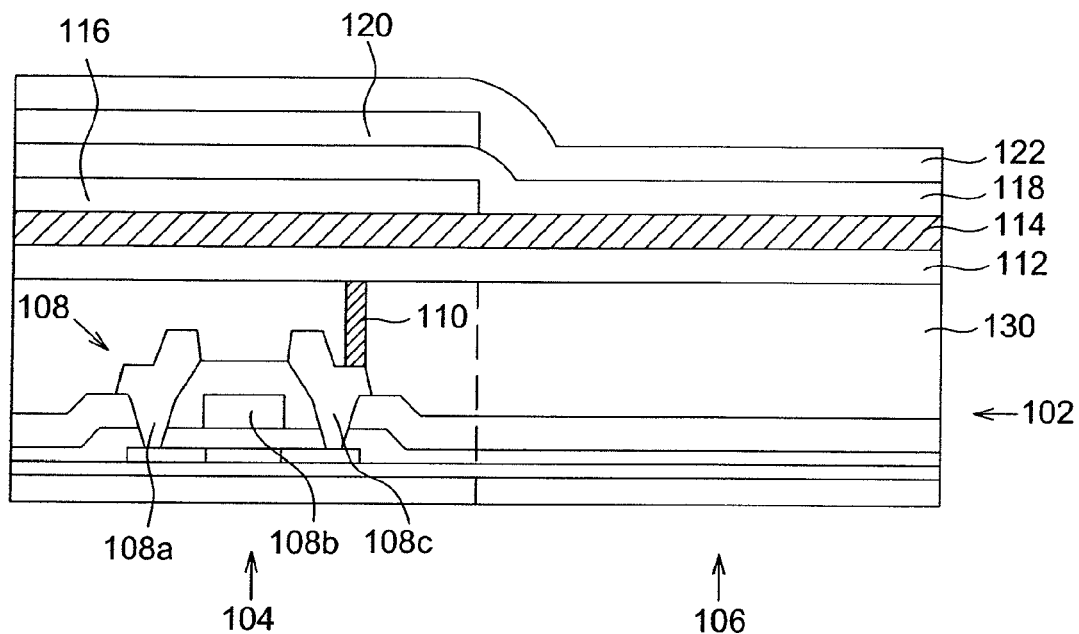
Figure 2I:
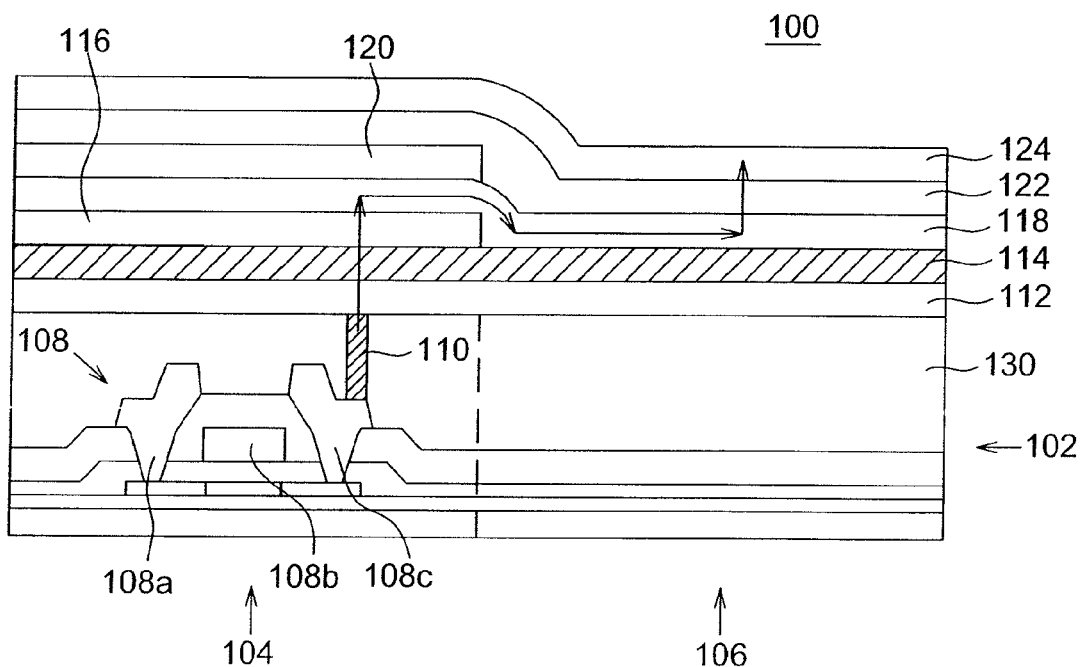

FIG. 2i illustrates a pixel of a top emission OLED of the display device 100. As shown in FIG. 2a, the method of manufacturing a display device includes the following steps: providing a substrate having a first area 104 and a second area 106; and forming a driving element 108 within the first area 104. The substrate 102 can be selected from those substrates generally adopted in the display industry. The substrate 102 can further have some elements thereon, such as polarizers and capacitors. A passivation layer 130 can also be disposed on the substrate 102. The driving element 108 can be a thin film transistor, or any other electronic element for controlling the image display of the display device. The driving element 108 can have a source 108a, a drain 108c, and a gate 108b, and the source 108a and the drain 108c are coupled to the elements formed later via a contact 110 of the substrate 102.

In FIG. 2b and FIG. 2c, the embodiment of the present invention further includes selectively forming a second auxiliary layer 112 above the first area 104 and the second area 106 of the substrate 102; and then forming a reflective layer 114 on the second auxiliary layer 112. In this embodiment, the reflective layer 114 is coupled to the driving element 108 via the second auxiliary layer 112. The second auxiliary layer 112 also improves the adhesion of the reflective layer 114 to the passivation layer 130 of the substrate 102 because the adhesion of the second auxiliary layer 112 to the passivation layer 130 is better than that of the reflective layer 114 to the passivation layer 130. Meanwhile, the second auxiliary layer 112 also provides good adhesion to the reflective layer 114.

The reflective layer 114 can be aluminum, aluminum alloy, silver, silver alloy, nickel, palladium, copper, neodymium, or any combinations thereof, or any conductive material with reflectance not lower than 80%. The second auxiliary layer 112 can be titanium, tungsten molybdenum, indium tin oxide, indium zinc oxide, zinc oxide, or any combinations thereof, or any conductive material with good adhesion to both the reflective layer 114 and the passivation layer 130.

In FIG. 2e, the first auxiliary layer 116 is formed on the reflective layer 114 above the first area 104. In this embodiment shown in FIG. 2d, the first auxiliary layer 116 is first formed on the reflective layer 114 above both of the first area 104 and second area 106. Then as shown in FIG. 2e, the first auxiliary layer 116 right above the second area 106 is removed while the first auxiliary layer 116 right above the first area 104 remains. The first auxiliary layer 116 can be formed by way of sputtering, evaporation, chemical vapor disposition, etc. The first auxiliary layer 116 right above the second area 106 can be removed by lithography and etching processes. The first auxiliary layer 116 would improve the electrical characteristic of the reflective layer 114 and would prevent the hillock and/or the oxidation on the reflective layer 114 resulted from the subsequent processes. The reflectance of the first auxiliary layer 116 is not greater than that of the reflective layer 114. The first auxiliary layer 112 can include titanium, tungsten molybdenum, indium tin oxide, indium zinc oxide, zinc oxide, or any conductive material with reflectance not greater than 80%.

In FIG. 2f, a transparent electrode 118 is formed on the first auxiliary layer 116 above the first area 104 and on the reflective layer 114 above the second area 106. In the embodiment of a self-luminous display device, the transparent electrode 118 is adopted as an anode or a cathode, to provide the current to light emitting material formed thereon later. During the operation of the display device 100, the current flows from the driving element 108, via the reflective layer 114 above the first area 104, the first auxiliary layer 116, the transparent electrode 118 on the first auxiliary layer 116, and to the transparent electrode 118 on the reflective layer 114. The transparent electrode 118 may be indium tin oxide, indium zinc oxide, zinc oxide or any combinations thereof, and any other transparent conductive materials. The work function of the transparent electrode 118 is between 4.0 and 6.0 eV. The formation of the transparent electrode 118 may require oxidation process, and thus result in the oxidation of the metal layer placed below, e.g., the reflective layer 114. In the present invention, the first auxiliary layer 116 blankets the reflective layer 114 placed above the first area. Thus when the transparent electrode 118 is formed, the reflective layer 114 above the first area 104 will not be oxidized and can provide a good conductive path.

In FIG. 2g, a pixel defining layer 120 is formed above the first area 104 for defining the display pixel above the second area 106. In an embodiment, the pixel defining layer 120 can be formed first above both of the first area 104 and the second area 106, and then the portion above the second area 106 would be removed. The pixel defining layer 120 can include oxides, nitrides, resists, etc.

Then a light emitting material 122 is formed on the reflective layer 114 above the second area 106. For the embodiment of a self-luminous display device 100 as shown in FIG. 2h, the light emitting material 122 is placed on the transparent electrode 118 to receive the driving current. The light emitting material 122 is also placed above the first area 104; because the pixel defining layer 120 is typically a dielectric, the light emitting material thereon can't display. The steps and the structure described here can simplify the manufacture process. In addition, the light emitting material 122 can be organic light emitting materials or any other electroluminescent materials.

Next as shown in FIG. 2i, another electrode 124 is formed on the light emitting material 122, so as to produce a top emission OLED for the embodiment of a display device 100. The electrode 124, together with the transparent electrode 118, provides the current flow to the light emitting material 122 generating the light. The electrode 124 can also be the transparent electrode, and can include indium tin oxide, indium zinc oxide, zinc oxide or any combinations thereof. While the first auxiliary layer 116 improves the electrical characteristic of the reflective layer 114, the current now tends to flow towards the first auxiliary layer 116, and then reaches the transparent electrode 118 via the first auxiliary layer 116. See the arrow direction. During the operation of the display device 100, the current flows from the driving element 108, via the contact 110, the second auxiliary layer 112 above the first area 104, the reflective layer 114, the first auxiliary layer 116, the transparent electrode 118 on the first auxiliary layer 116, to the transparent electrode 118 on the reflective layer 114. By such arrangement, the light emitting material 122 is driven to generate light.

In the display device 100 according to the embodiment of the present invention, the reflective layer 114 with a higher reflectance above the second area 106, the display area, reflects light to achieve better reflection effect. Meanwhile, the reflective layer 114 right above the first area 104 has the first auxiliary layer 116 on it to improve the electrical characteristic of the reflective layer 114 and to prevent the hillock or the oxidation on the reflective layer 114. Accordingly, the current can have a good conductive path to drive the light emitting material 122. In other words, the reflective layer 114 that is placed above the second area 106 provides a higher reflectance to reflect light, while the first auxiliary layer 116, the reflective layer 114, and the second auxiliary layer 112 that are placed above the first area 104 together have a better electrical characteristic to form a good conductive path for the current.

Figure 3:
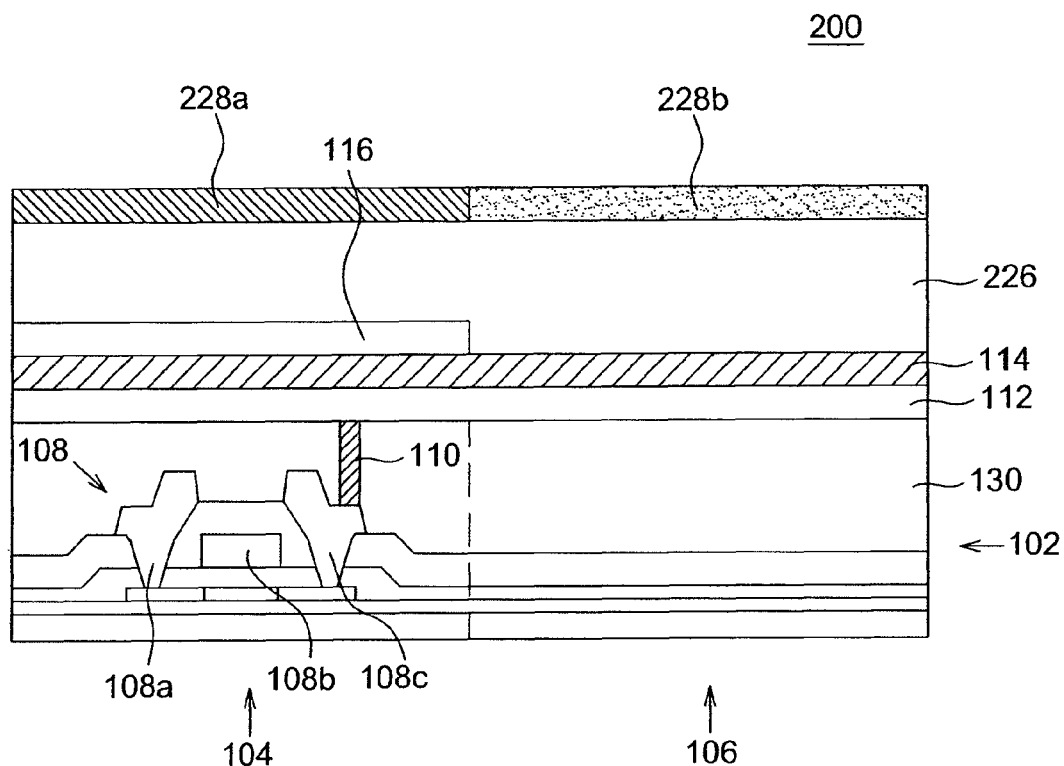
FIG. 3 shows a pixel of a reflective-type display device according to an embodiment.

FIG. 3 shows a pixel of a reflective-type display device 200 according to another embodiment of the present invention, wherein the forming steps of the elements 102-116 and 130 are similar to what are illustrated in FIG. 2a to FIG. 2e and are thus omitted hereinafter. The reflective-type display device 200 further includes a liquid crystal layer 226 on the first auxiliary layer 116 and the reflective layer 114, and the device 200 also includes a black matrix structure 228a and a color filtering layer 228b on the liquid crystal layer 226. The ambient light would be reflected by the reflective layer 114, then be modulated by the liquid crystal layer 226 and the color filtering layer 228b, and reach the viewer. The reflective layer 114 that is placed above the second area 106 provides a higher reflectance to reflect light, while the first auxiliary layer 116, the reflective layer 114, and the second auxiliary layer 112 that are placed above the first area 104 together have a better electrical characteristic to form a good conductive path for the current.

Figure 4:
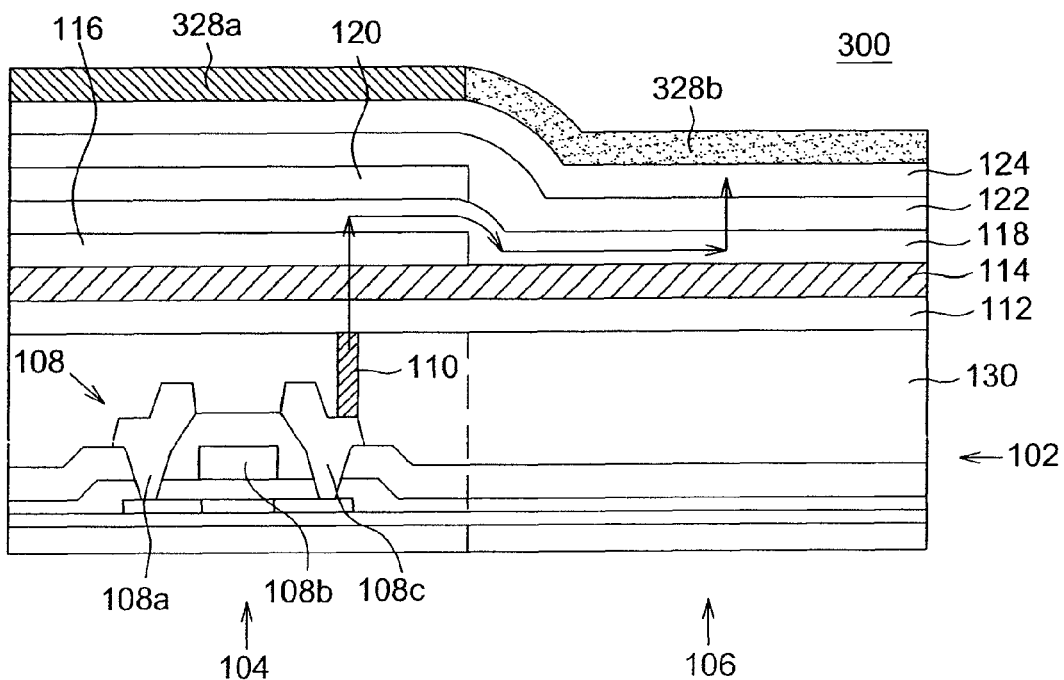
FIG. 4 shows a pixel of a display device according to another embodiment.

FIG. 4 shows a pixel of a display device 300 according to yet another embodiment of the present invention, wherein the forming steps of the elements 102-124 are similar to what are illustrated in FIG. 2a to FIG. 2i and are thus omitted hereinafter. The display device 300 further includes a black matrix structure 328a and a light filtering layer 328b above the light emitting material 122 (on the electrode 124 in this embodiment). The black matrix structure 328a and the light filtering layer 328b are provided for modulating the light emitted from the light emitting material 122 in order to obtain the desired color. The reflective layer 114 that is placed above the second area 106 provides a higher reflectance to reflect light, while the first auxiliary layer 116, the reflective layer 114, and the second auxiliary layer 112 that are placed above the first area 104 together have a better electrical characteristic to form a good conductive path for the current.

Figure 5:
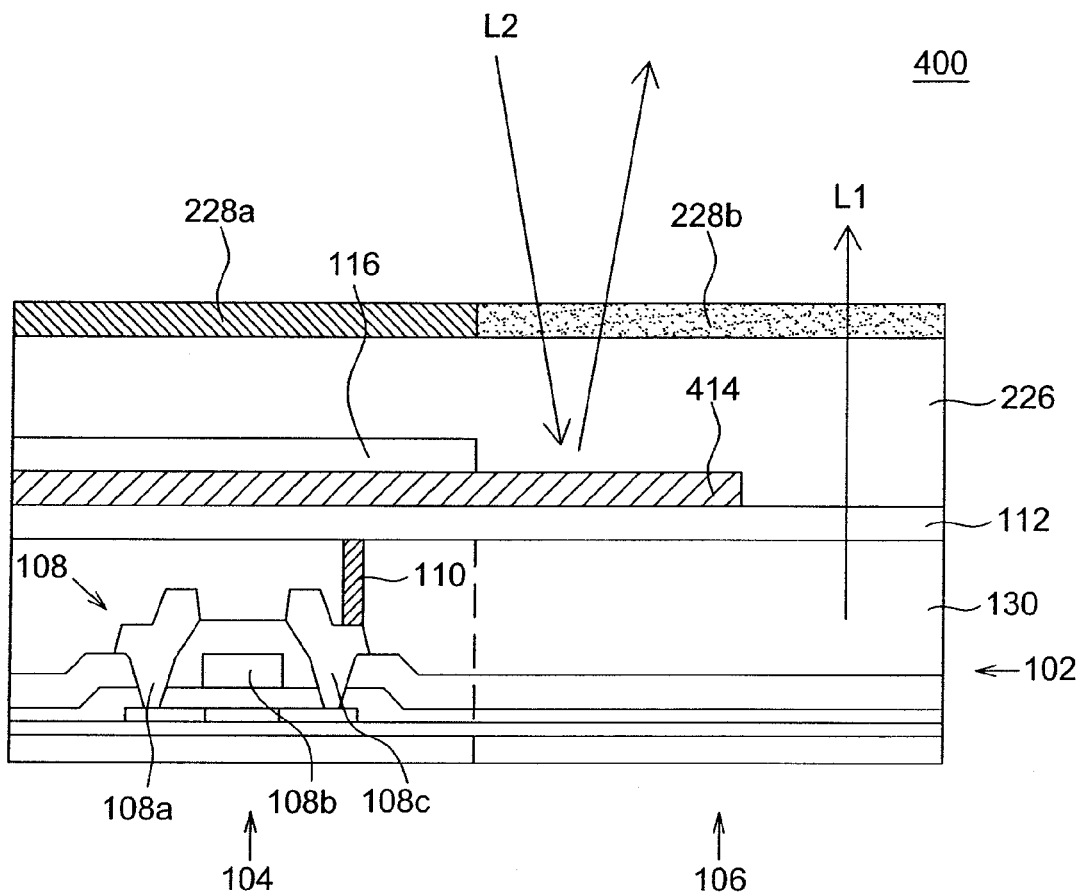
FIG. 5 shows a pixel of a transflective-type display device according to an embodiment.

FIG. 5 shows a pixel of a transflective-type display device 400 according to an embodiment of the present invention, wherein the forming steps of the elements are similar to what are illustrated in FIG. 3 for the display device 200. However, the reflective layer 414 does not cover all the second area 106, but allows the light L1 from the backlight (not shown) pass through the liquid crystal layer 226 so as to be modulated by the liquid crystal layer 226 and the color filtering layer 228b before reaching the viewer. The display device 400 may include light retardation elements (not shown) for retarding the reflective light and the transmissive light. In the display device 400 shown in FIG. 5, the reflective layer 414 right above the second area 106 reflects light to display image. The reflective layer 414 here has a higher reflectance resulting in better reflection effect. Meanwhile, the reflective layer 414 above the first area 104 has the first auxiliary layer 116 to improve the electrical characteristic of the reflective layer 414 and to prevent the hillock or the oxidation on the reflective layer 114. Accordingly, there is a good conductive path for the current to drive the liquid crystal 226. The reflective layer 114 that is placed above the second area 106 provides a higher reflectance to reflect light, while the first auxiliary layer 116, the reflective layer 114, and the second auxiliary layer 112 that are placed above the first area 104 together have a better electrical characteristic to form a good conductive path for the current.

Figure 6:
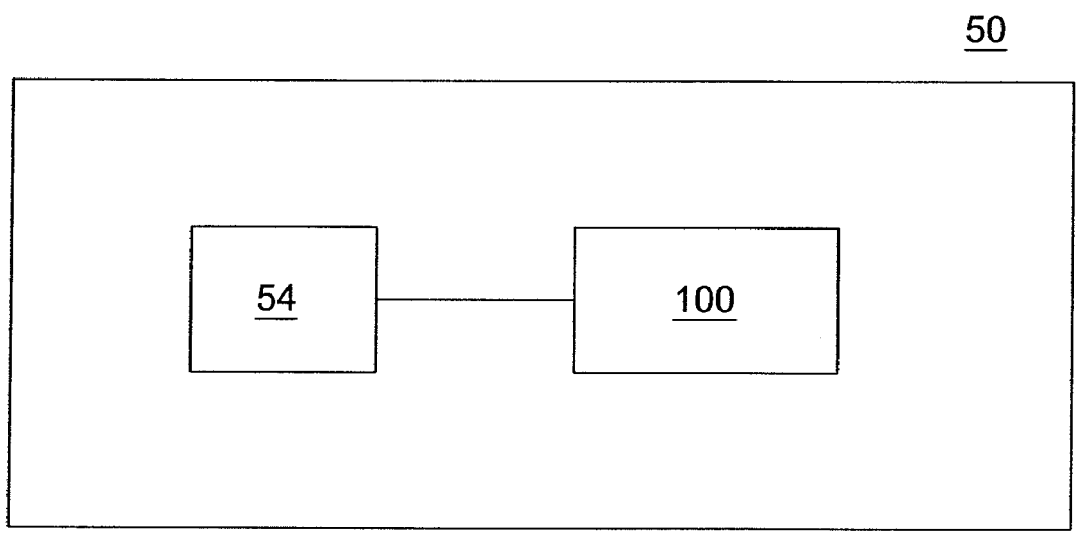
FIG. 6 illustrates an electronic device according to an embodiment of the present invention.

FIG. 6 illustrates an electronic device 50 according to an embodiment of the present invention. The electronic device has a display device 100 shown in FIG. 2i and an input unit 54. Note that the display 100 embodied in the electronic device 50 can be replaced with the display device 200 (in FIG. 3), the display device 300 (in FIG. 4), or the display device 400 (in FIG. 5). The input unit 54 is coupled to the display device 100 and transmits signal to the display device 100 to control the display device displaying images. The electronic device 50 can be a mobile phone, a digital camera, a personal digital assistant (PDA), a notebook computer, a desktop computer, a television, a car media player, a portable video player, a GPS device, an avionics display or a digital photo frame.

While this invention has been described with reference to the illustrative embodiments, these descriptions should not be construed in a limiting sense. Various modifications of the illustrative embodiment, as well as other embodiments of the invention, will be apparent upon reference to these descriptions. It is therefore contemplated that the appended claims will cover any such modifications or embodiments as falling within the true scope of the invention and its legal equivalents.

The invention claimed is:

1. A display device, comprising:
   a substrate having a first area and a second area thereon;
   a driving element placed within said first area;
   a reflective layer placed above said first area and above at least a portion of said second area, said reflective layer coupled to said driving element; and
   a first auxiliary layer placed on said reflective layer and directly above said driving element;
   wherein said first auxiliary layer improves an electrical characteristic of said reflective layer, and a reflectance of said first auxiliary layer is not greater than a reflectance of said reflective layer.

2. A display device according to claim 1, further comprising a light emitting material placed on said reflective layer above said second area.

3. A display device according to claim 2, further comprising a light filtering layer above said light emitting material.

4. A display device according to claim 1, further comprising:
   a transparent electrode placed on said first auxiliary layer above said first area and placed on said reflective layer above said second area;
   wherein during the operation of said display device, a current flows from said driving element, via said reflective layer above said first area, said first auxiliary layer, said transparent electrode on said first auxiliary layer above said first area, to said transparent electrode on said reflective layer above said second area.

5. A display device according to claim 1, further comprising:
   a second auxiliary layer placed between said reflective layer and said substrate for improving adhesion between said reflective layer and said substrate.

6. A display device according to claim 5, wherein said second auxiliary layer comprises titanium, tungsten molybdenum, indium tin oxide, indium zinc oxide, zinc oxide, or any combinations thereof.

7. A display device according to claim 1, wherein said reflective layer comprises aluminum, aluminum alloy, silver, silver alloy, nickel, palladium, copper, neodymium, or any combinations thereof.

8. A display device according to claim 1, wherein said first auxiliary layer comprises titanium, tungsten molybdenum, indium tin oxide, indium zinc oxide, zinc oxide, or any combinations thereof.

9. A display device according to claim 1, further comprising a liquid crystal layer placed on said reflective layer above said second area and on said first auxiliary layer above said first area.

10. An electronic device, comprising:
    a display device according to claim 1, and
    an input unit, coupled to said display device;

wherein said display device is controlled to display images in response to signals input from said input unit.

11. An electronic device according to claim 10, wherein said electronic device is a mobile phone, a digital camera, a personal digital assistant (PDA), a notebook computer, a desktop computer, a television, a car media player, a portable video player, a GPS device, an avionics display or a digital photo frame.

12. A display device, comprising:
a substrate having a first area and a second area thereon;
a driving element placed within said first area;
a reflective layer placed above said first area and above at least a portion of said second area, said reflective layer coupled to said driving element;
a first auxiliary layer placed on said reflective layer above said first area; and
a second auxiliary layer placed between said reflective layer and said substrate for improving adhesion between said reflective layer and said substrate;
wherein said first auxiliary layer improves an electrical characteristic of said reflective layer, and a reflectance of said first auxiliary layer is not greater than a reflectance of said reflective layer.

13. A display device according to claim 12, wherein said second auxiliary layer comprises titanium, tungsten molybdenum, indium tin oxide, indium zinc oxide, zinc oxide, or any combinations thereof.

* * * * *